United States Patent [19]

Furniss et al.

[11] Patent Number: 5,003,308
[45] Date of Patent: Mar. 26, 1991

[54] SERIAL DATA RECEIVER WITH PHASE SHIFT DETECTION

[75] Inventors: Stephen Furniss, Romsey; Adrian C. F. Lee, Winchester; Philip J. Murfet, Braishfield; Michael J. Palmer, Romsey; Christopher N. Wallis, Winchester; Thomas Winlow, Eastleigh, all of England

[73] Assignee: International Business Machines Corporation, Armonk, N.Y.

[21] Appl. No.: 501,449

[22] Filed: Mar. 28, 1990

[30] Foreign Application Priority Data

Mar. 29, 1989 [GB] United Kingdom ............... 89303070

[51] Int. Cl.[5] .............................................. H03M 9/00
[52] U.S. Cl. ...................................... 341/100; 341/63
[58] Field of Search .................... 341/63, 100, 70, 71

[56] References Cited

U.S. PATENT DOCUMENTS

| | | | |
|---|---|---|---|
| 4,216,460 | 8/1980 | Baldwin et al. | 341/100 |
| 4,446,516 | 5/1984 | Nishimura | 341/63 |
| 4,833,471 | 5/1989 | Tokuume et al. | 341/63 |
| 4,901,076 | 2/1990 | Askin | 341/63 |

FOREIGN PATENT DOCUMENTS

| | | | |
|---|---|---|---|
| 0313875 | 5/1989 | European Pat. Off. | 341/100 |
| 0030099 | 2/1988 | Japan | 341/100 |
| 0050139 | 3/1988 | Japan | 341/63 |
| 0029122 | 1/1989 | Japan | 341/100 |

Primary Examiner—William M. Shoop, Jr.
Assistant Examiner—Nancy Le
Attorney, Agent, or Firm—Charles E. Rohrer

[57] ABSTRACT

An asynchronous serial data receiver for receiving a stream of data bits, characterized by a plurality of shift registers (54) into which samples corresponding to points within said data bit stream are read, different shift registers (54) holding a different set of said samples, said points being separated by most one half of a data bit period, and a decoder (60-90) responsive to said samples held in said shift registers (54) for recognizing points of known phase within said data assessed relative to which samples which corresponding to points within said data bits may be identified for reading. The invention provides a high speed serial receiver which is particularly suitable for use within disc drives and data storage and retrieval systems in general. The serial data receiver of the present invention does not require a clock synchronized with the incoming data. Furthermore the serial data receiver is able to share the sampling of the data bit stream between a plurality of shift registers (54) none of which need be clock more than once per data bit period.

11 Claims, 6 Drawing Sheets

```
O •      O •      I •      I •      I O
O •      I •      I •      I O      • O
I •      I •      I O      • O      • O
I •      I O      • O      • O      • O       "•" ≡ I OR 2
I O      • O      • O      • I      • I
PAT(A)   PAT(B)   PAT(C)   PAT(D)   PAT(E)
```

SERIAL DATA RECEIVER WITH PHASE SHIFT DETECTION

This invention relates to the field of serial data receivers. More particularly, this invention relates to serial data receivers for receiving asynchronous serial data, i.e., serial data for which the phase is unknown.

In an asynchronous serial transmission system, data bits are sent and received sequentially, with groups of bits collected together in transmission words. Each word usually holds the same number of data bits as the others. The rate at which the bits within the word are transmitted is fixed and is known to both the sender and receiver. Typically, this bit rate is fixed by crystal oscillators at each end of the serial data link. However, the rate at which words are sent is not fixed and so the phase of the incoming data bits will have no fixed relationship to the local clock at the receiver. To correctly receive the data bits, the incoming data signal must be sampled at a rate greater than the transmitted data bit rate in order to recover enough phase information to allow the data bits in each word to be decoded properly.

One known asynchronous serial data receiver is that shown in GB1507761. The approach taken is to rapidly sample the input data line to identify the leading edge of the first bit of the input data word. This sampling is carried at a rate many times in excess of the input data rate (e.g., 16 or 64 samples per data bit period depending on the precision required). The first bit of the input data word is a start bit. The start bit is provided for the purpose of establishing synchronization and does not carry any information. The detection of the leading edge of the start bit is used to synchronize the clock of the receiver with the input data. The synchronized clock is then used to control the receiver to sample the input data line once per data bit period at a time corresponding to the midpoint of each data bit period. The input data is loaded directly into a shift register and when all the data bits of that word have been received, then the data is parallel shifted out of the shift register onto a data bus. The data bus passes the data to the rest of the circuit.

Such known asynchronous serial data receivers suffer from the disadvantage that the operation of the receiver must be synchronized with the incoming data by detecting the leading edge of the start bit before the data can be read. This requirement has the effect that specific circuit elements and data/control lines have to be provided to provide this synchronized operation. In addition, the sampling of the input data line so as to locate the leading edge of the start bit must necessarily take place at a rate many times greater than the data rate in order that the phase of the input data can be accurately determined. The maximum sampling rate for identifying the leading edge is limited by the maximum rate at which the shift register can be driven and since the data rate is necessarily a small fraction of the sampling rate, then this effect also limits the maximum data rate which can be received.

Viewed from one aspect the present invention provides an asynchronous serial data receiver for receiving a stream of data bits, characterized by a plurality of shift registers into which samples corresponding to points within said data bit stream are read, different shift registers holding different sets of said samples, said points being separated by at most one half of a data bit period, and a decoder responsive to said samples held in said shift registers for recognizing points of known phase within said data assessed relative to which, samples which correspond to points within said data bits may be identified for reading.

The present invention provides an asynchronous serial data receiver in which for shift registers capable of being driven at a given maximum rate the receiver is able to receive asynchronous serial data at a higher data rate than known receivers. This advantage is a result of the feature of the present invention whereby the sampling of the data is shared between a plurality of shift registers, each shift register needing only to be clocked at a fraction of the sampling rate. Another advantage of the present invention is that no circuit elements need be provided to control at what times the data is sampled. In accordance with the invention, the times at which the data is sampled into the shift registers are not responsive to the phase of the data; it is the function of the decoder to identify those samples which correspond to points within the data bits from the collection of samples taken. It will be appreciated that providing the samples read as the data bits do actually lie within the correct bit then the position of the sample within the bit is not important. However, in preferred embodiments, the samples most closely corresponding to midpoints of said data bits are read. This gives the receiver an improved immunity to electrical noise.

In one preferred embodiment of the present invention said data bit stream is sampled into a sample delay line having a plurality of stages, said samples being periodically read from said sample delay line into said shift registers. This feature has the advantage that no circuit elements need be provided to provide each shift register with appropriately timed signals triggering it to sample the data bit stream. Instead the sample delay line ensures that the samples read into the shift registers are suitably spaced and a single signal triggers all the shift registers to read the sample stored in a corresponding one of the sample delay line stages.

The operation of the delay line must be regulated so that the samples read into the sample delay line have the correct spacing within the data bit stream, i.e., the spacing is neither too great nor too small. A preferred regulation mechanism comprises a control delay line having a plurality of stages with a delay matched to that of said sample delay line, wherein the delays of both said sample delay line and said control delay line are adjusted by a common feedback signal to phase lock said control delay line to a receiver clock signal. Since the sample delay line is matched to the control delay line, then if the control delay line is phase locked to the clock, then the sample delay line will also effectively have its delay matched to the external clock. This feature of the present invention ensures that operation of the sample delay line is coordinated with the operation of the rest of the circuit and that the samples read into the shift registers correspond to points within the data bit stream spaced by known times.

According to a further preferred feature said control delay line is configured as a ring oscillator. A ring oscillator has the advantage of being self starting, i.e., requiring no external initialization.

In another embodiment of the present invention, the sampling of the data bit stream into the shift registers may be controlled by a single delay line. In this embodiment, the receiver includes a control delay line configured as a ring oscillator phase locked to a receiver clock signal, wherein a plurality of timing signals used to control sampling of said data bit stream into said shift registers are derived from differing points along said delay line.

A preferred form of this embodiment further comprises a plurality of latches, wherein each timing signal is fed to a corresponding latch to trigger reading of said data bit stream into said corresponding latch, each latch then being read into one of said shift registers. This embodiment avoids the need to match the components and loading of the sample and delay control lines as required in the previous embodiments.

A possible problem with the control delay line as discussed above is that it is stable with two or more pulses propagating along the control delay line at any one time. The result of this would be that the delay introduced by each delay line could be less than that introduced when only a single pulse was propagating along the control delay line at any one time since the arrival of each pulse at the end of the control delay line would be phase locked to the external clock. The samples of the data bit stream would then be taken at points which were too widely spaced making decoding of the samples stored in the shift registers difficult.

In a preferred embodiment of the present invention, this problem is overcome by providing synchronization logic responsive to said stages of said control delay line, wherein if said synchronization logic detects more than one pulse propagating along said control delay line then said synchronization logic produces an adjusting signal which is fed to said control delay line to adjust operation of said control delay line to provide a single pulse propagating along said control delay line. The provision of this synchronization logic overcomes the problems that can occur with more than one pulse propagating along the control delay line.

Another problem which can arise with the serial data receiver of the present invention is that the receiver clock signal controlling the receiver may be at a lower frequency than the maximum rate at which the circuit elements of the receiver itself can operate. A possible cause of this is that the receiver clock signal may have to be shared with the entire unit of which the serial receiver forms part. In this case, the receiver clock signal must be supplied to all the circuits requiring it from a common source. The circuits requiring the receiver clock signal will often be found within different integrated circuits and the receiver clock signal will have to be passed into each integrated circuit package through its connector pins. The maximum rate at which a signal may be passed into an integrated circuit through a connector pin may be less than the maximum signal rate which can be supported within the integrated circuit. In such cases, the maximum clock rate of the circuit will be limited by the circuit unit capable of handling the lowest rate.

This problem may be overcome by providing a ring oscillator frequency divider to provide a reduced frequency signal derived from said ring oscillator prior to comparison with the receiver clock signal, whereby said ring oscillator runs at a higher frequency than said receiver clock signal. Further flexibility may be provided in the frequency of operation by including a clock frequency divider to provide a reduced frequency signal derived from said receiver clock, whereby the ratio between the frequencies of said ring oscillator and said receiver clock may be varied.

As previously mentioned, it is the function of the decoder to interpret the patterns of samples held within the shift registers so as to recognize points of known phase and identify the samples corresponding to the midpoints of the data bits. In a preferred embodiment, said decoder recognizes any one of a set of predetermined patterns of samples corresponding to points of known phase within said data bit stream.

It will be appreciated that the transitions within the data bit stream can provide the points of known phase and these will not occur with regular spacings. A transition is not guaranteed for each data bit and so points of known phase may be spaced by several bit periods. In a particularly preferred embodiment of the present invention, said decoder recognizes a transition within the data bit stream and assesses the samples to be read relative to this transition until the next transition is detected. This overcomes the problem of the irregular spacing of points of known phase within the data bit stream.

One problem which can occur is that electrical noise mixed with the data bit stream may cause false transitions to be detected or jitter displacing a transition from its true position. The problem of electrical noise producing false transitions can be reduced if said patterns recognized by said decoder comprise a plurality of samples consistent with a pretransition data stream value and a plurality of samples consistent with a post-transition data stream value. It is unlikely electrical noise could produce false samples consistent with a transition which extent over a plurality of samples.

The problems caused by jitter can be reduced if said decoder is arranged such that when a pattern is recognized indicating that the samples to be read correspond to samples different from those currently assessed to be read, then said decoder changes state to shift the position of those samples assessed to be read towards those assessed relative to said detected point of known phase subject to a predetermined maximum shift which is less than half the number of samples taken per bit period. It will be appreciated that decoder will normally be required to shift the samples assessed to be read as a result of slow drift in the phase of the data bit stream. The shifting necessary to compensate for this slow drift will normally be to identify an adjacent sample as the sample to be read. In contrast, electrical noise and particularly jitter may produce a pattern of samples indicating a much larger shift in the samples to be read. In accordance with the above feature, the shift is constrained to be somewhere below the maximum possible shift, i.e., below half the number of samples per data bit period. This suppresses the large shifts that can be caused by electrical noise.

The number of samples taken per data bit period can also have an effect upon the noise immunity of the receiver. If the numbers of samples is increased, then the points of known phase can be more accurately timed and samples more closely corresponding to the midpoint may be read. In addition, the patterns recognized as points of known phase can include a larger number of samples. However, as the number of samples read increases, so the number of circuit elements needed to sample, store and decode the data increases, which in turn increases the cost of the receiver and the number of circuit elements in which a fault may occur.

It has been found that if said data bit stream is sampled at a rate substantially corresponding to five samples per data bit period, then this combines sufficient noise immunity with a relatively low number of circuit elements.

The number of circuit elements necessary may be further reduced if said samples are decoded once per data bit period, thereby reducing the total number of samples stored at any one time. This arrangement also simplifies the necessary decoding logic. However, if the samples are decoded once per data bit period as timed by the receiver clock, then a number of new problems arise. Slow drift in the phase of the data bit stream can produce the situation in which two readable samples occur within a period which the receiver clock times as one data bit period.

Alternatively, the situation may arise in which no readable samples occur within a period which the receiver clock times as one data bit period.

The first of these situations is associated with the case in which the data bit period is slightly less than the period timed by the receiver clock as corresponding to the data bit period. In this case the readable sample will drift towards the start of the period timed by the receiver. At some a readable sample occurs as the first sample in the period timed by the receiver and the last sample in that period corresponds to the readable sample of the following data bit. Thus, a single period timed by the receiver contains two readable samples. Similarly, if the data bit period is slightly greater than the period timed by the receiver, then the readable sample will drift towards the end of the period timed by the receiver. At some point, the readable sample will switch from being the last sample in the period timed by the receiver to being the first sample in the next but one sample timed by the receiver. Thus, one timed period contains no readable sample In a preferred embodiment of the present invention, when said decoder recognizes a sample pattern indicative of the need to change the sample read from being the first sample in the current period timed by said receiver to being the last sample in the next period to be timed by said receiver, also triggers the reading of the last sample in said current period timed by said receiver. This ensures that both the samples are read and no information is lost.

Another preferred feature of the present invention is that when said decoder recognizes a sample pattern indicative of the need to change the sample read from being the last sample in the current period timed by said receiver to being the first sample in the next but one period timed by said receiver also triggers no sample to be read from the next period timed by said receiver. This ensures that only samples actually corresponding to valid data are read.

As discussed above, the patterns recognized by the decoder as corresponding to points of known phase are made up of a plurality of samples to give a degree of noise immunity. While the periods timed by the receiver have substantially the same duration as the actual bit periods, they have no fixed phase relationship between them. Accordingly the samples corresponding to a point of known phase may be split between two of the periods timed by the receiver. Thus, preferably the shift registers hold samples corresponding to at least two periods timed by the receiver. It is however desirable to keep the number of circuit elements within the receiver to a minimum and accordingly in a preferred embodiment said shift registers have two stages, each stage holding a sample from adjacent periods timed by said receiver.

As discussed above, the data bits are decoded one bit at a time, with provision being made for either two or zero bits being decoded in any one period timed by the receiver so as to account for the effects of differences in the actual and timed periods. Preferably, bits decoded by said receiver are collected within a bit collection register, a counter being arranged to count the number of bits inputted to the bit collection register since said bit collection register was last read and to trigger reading of said bit collection register when an appropriate number of data bits have been decoded. This feature allows the serial data decoded to be outputted in parallel to the rest of the circuit to which the receiver is connected.

One problem the receiver must overcome is how to determine at what points to split the data bit stream into data words. A particularly efficient way of achieving this is to transmit a predetermined pattern of data bits which are recognized by the receiver as forming a synchronization word. The recognition of this synchronization word provides a reference relative to which the stream of data bits may be split into data words. A preferred embodiment of the present invention includes a synchronization word detector for monitoring decoded data bits and providing a synchronization word signal upon recognition of a synchronization word, said synchronization word signal being used to split said decoded data bits into data words.

Viewed from a second aspect, the present invention provides a disc drive including an asynchronous serial data receiver for receiving a stream of data bits, characterized by a plurality of shift registers into which samples corresponding to points within said data bit stream are read, different shift registers holding different sets of said samples, said points being separated by at most one half of a data bit period, and a decoder responsive to said samples held in said shift registers for recognizing points of known phase within said data assessed relative to which samples which correspond to points within said data bits may be identified for reading. It is desirable for disc drive systems to be as compact as possible and these leads serial data transmission to be preferred over parallel data transmission since parallel data transmission requires the use of bulky parallel wiring connection. However, it is vital to the performance of the disc drive that the rate at which it can receive data is as high as possible. This consideration makes the present invention particularly applicable to disc drive requiring a high speed serial link.

Viewed from a third aspect, the present invention provides a data storage and retrieval system including an asynchronous serial data receiver for receiving a stream of data bits, characterized by a plurality of shift registers into which samples corresponding to points within said data bit stream are read, different shift registers holding different sets of said samples, said points being separated by at most one half of a data bit period, and a decoder responsive to said samples held in said shift registers for recognizing points of known phase within said data assessed relative to which samples which correspond to points within said data bits may be identified for reading. It will be appreciated that the present invention will also be particularly useful in data storage and retrieval systems in general were high speed and simple interconnection are an advantage.

Viewed from a fourth aspect, the present invention provides a method of receiving asynchronous serial data characterized by reading different sets of samples corresponding to points within said serial data into different shift registers, said points being separated by at most one half of a data bit period, decoding said samples to recognize points of known phase within said data, and assessing said samples relative to said points of known phase to identify for reading samples which correspond to points within said data bits.

Preferred embodiments of the invention will now be described, by way of example only, with reference to the accompanying drawings in which.

Figure 1:
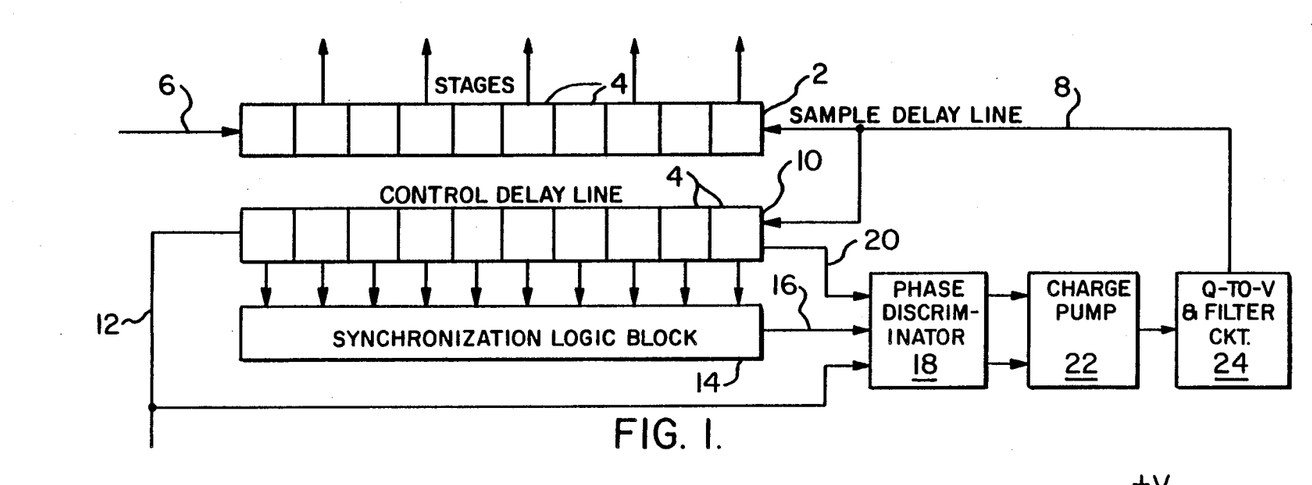
FIG. 1 schematically illustrates a first embodiment of a circuit for supplying the samples of the serial data stream to the rest of the receiver circuit.

FIG. 1 shows a sample delay line 2 comprising ten delay line stages 4. The asynchronous serial data stream is fed to the sample delay line 2 along data line 6. A control line 8 supplies a control signal to the sample delay line 2 which controls the rate at which samples are both read into the sample delay line 2 from data line 6 and passed down the sample delay line 2 between the stages 4. A control delay line 10 having ten stages 4, which are identical to the stages 4 of the sample delay line is disposed adjacent the sample delay line 2. A clock line 12 feeds an external clock signal to the control delay line 10. The clock signal read into the control delay line 10 is passed down the control delay line between the stages 4. The control line 8 also supplies the control signal to the control delay line 10.

A synchronization logic block 14 monitor the stages 4 of the control delay line 10 and outputs a blocking signal on block line 16 if more than one clock pulse is detected propagating along the control delay time at any one time. The logic required to perform this function will be apparent to those skilled in the art and will not be further described. A phase discriminator 18 receives the clock signal along clock line 12, the blocking signal along block line 16 and samples the output from the last stage 4 of the control delay line 10 along sample line 20. A suitable phase discriminator 18 is disclosed in IBM TECHNICAL DISCLOSURE BULLETIN, Sept. 1987, pages 1611-1613. The phase discriminator 18 produces at its outputs signals indicating the relative phase of the output from the last stage 4 of the control delay line 10 and the clock signal. The blocking signal, if present, overrides the relatives phase signal and acts on the phase discriminator 18 to reduce the delay of each stage of the control delay line 10 until a single signal is propagating along the control delay line 10. It can thus be seen that the synchronization logic block 14 adjusts the operation of the control delay line 10 using the phase discriminator 18.

A charge pump 22 receives the outputs from the phase discriminator 18 and causes a change in the charge stored in a charge-to-voltage and filter circuit 24 in proportion to the phase difference detected by the phase discriminator 18. The charge-to-voltage and filter circuit 24 stores the charge from the charge pump 22, converts the charge to a voltage and provides bandwidth control for the control delay line 10. The voltage produced by the charge to voltage and filter circuit 24 forms the control signal on control line 8.

The circuit operates to hold the total delay in the control delay line 10 equal to one clock period, i.e., the control delay line 10 is phase locked to the clock. Since the sample delay line 2 has the same number of stages as the control delay line 10 and the stages of both are identical and matched to have the same loads, etc., then the delay of each stage and the delay of both line lines will be closely similar. Thus, the control signal fed to the sample delay line also effectively matches the delay of the sample data line to the clock. Accordingly, alternate samples of the serial data stream stored in the stages 4 of the sample delay line 2 as it is propagated therethrough will represent samples of the data stream separated by one-fifth of a clock cycle and the samples stored in those stages may be read into a plurality of shift registers (not illustrated in FIG. 1) in accordance with the present invention. If the clock rate is equal to the data rate, then the samples will represent points separated by one fifth of a data bit period. The reading of the samples in the plurality of shift registers may be triggered by a signal derived from the clock signal, i.e., once per clock/data bit period.

Figure 2:
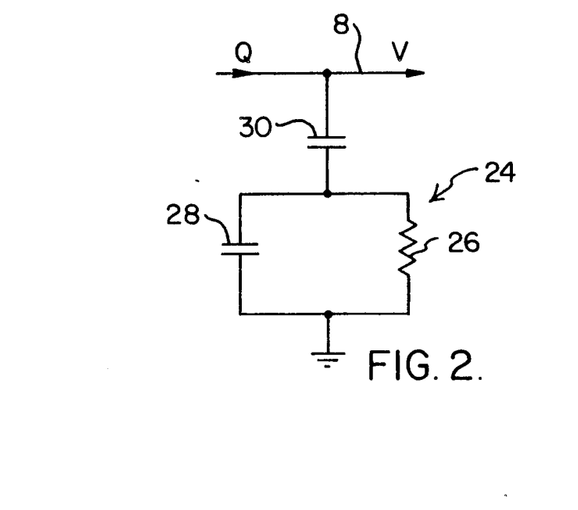
FIG. 2 illustrates in more detail one part of the circuit illustrated in FIG. 1.

FIG. 2 illustrates the charge-to-voltage (Q-to-V) and filter circuit 24 in more detail. The circuit comprises a resistor 26 and capacitor 28 in a parallel network which is, in turn, connected in series with a capacitor 30. The operation of the circuit is such that the output voltage (V) is proportional to the charge (Q) outputted from charge pump 22, subject to a degree of high frequency filtering.

Figure 3:
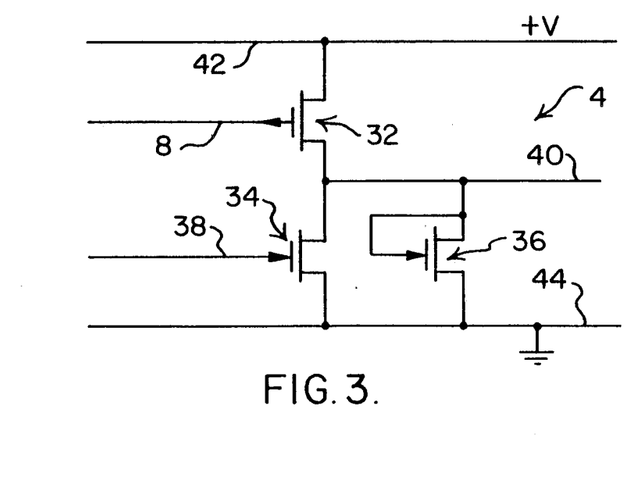
FIG. 3 illustrates in more detail another part of the circuit illustrated in FIG. 1.

FIG. 3 illustrates a stage 4 from which the delay lines 2, 10 are composed. The stage 4 comprises three FETs 32, 34 and 36 disposed between a positive power rail 42 and a ground rail 44. The control signal is fed to the gate of FET 32 and has the effect of adjusting the total delay introduced by the stage. The FET 34 has the input to the stage fed to its gate along line 38. The output of the stage 4 is taken along line 40 from the drain of FETs 34 and 36. The output is the complement of the input. The output from each stage 4 is fed as the input to the next stage in the delay line.

Figure 4:
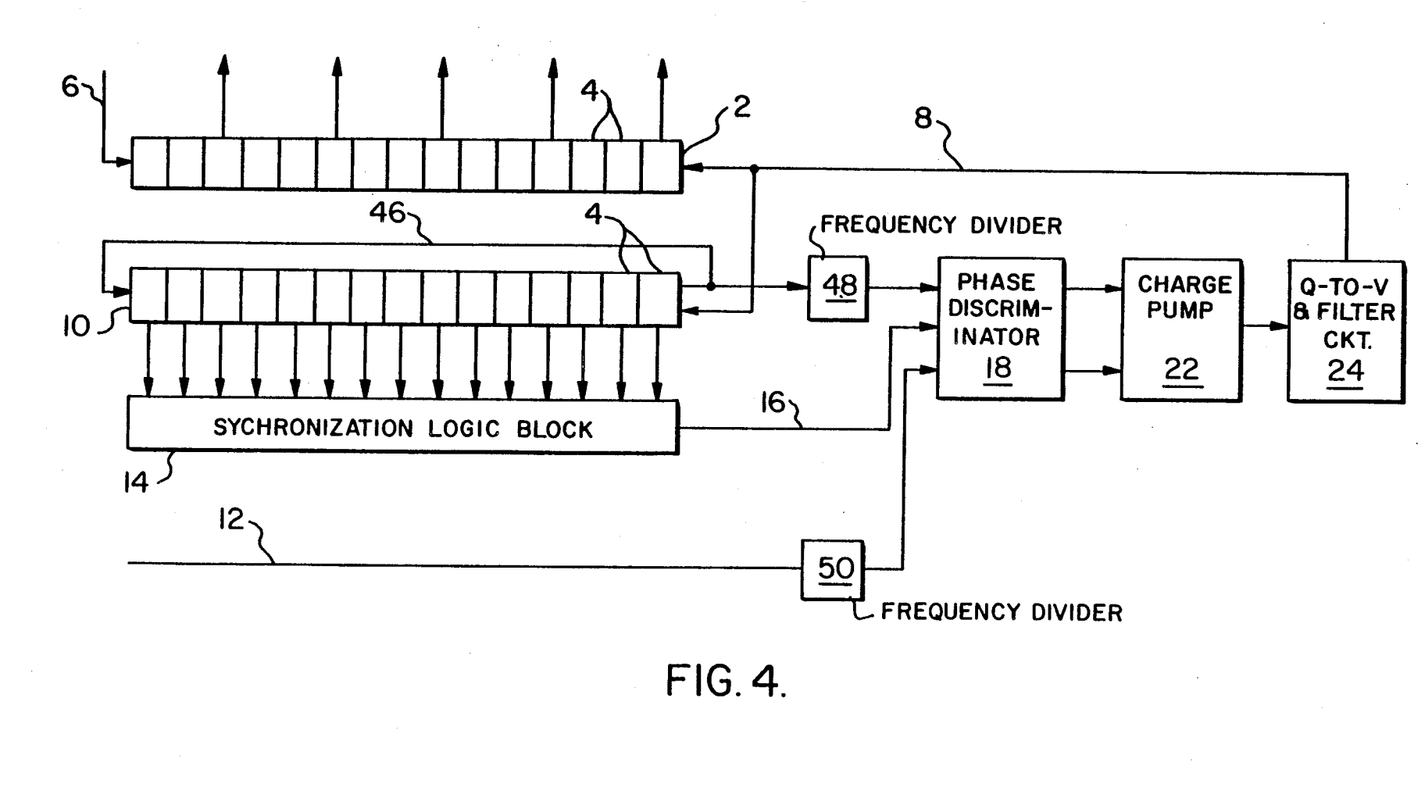
FIG. 4 schematically illustrates a second embodiment of a circuit for supplying the samples of the serial data stream to the rest of the receiver circuit.

FIG. 4 schematically illustrates a second embodiment of a circuit for suppling the samples of the serial data stream to the rest of the circuit. The circuit is a modified version of the circuit of FIG. 1. Common elements shared by the circuits are given the same reference numerals. This circuit differs from the circuit of FIG. 1 in the following manner.

A feedback line 46 supplies the output of the last stage 4 in the control delay line 10 to the first stage in the control delay line 10. The control delay 10 line thus functions as a ring oscillator. The output of the last stage of the control delay line 10 is also fed to a frequency divider 48, which produces an output fed to the phase discriminator 18 having a frequency which is an integral submultiple of the frequency of change of the last stage in the control delay line 10. The clock signal on clock line 12 is also passed through a frequency divider 50 before reaching the phase discriminator 18. The combined action of the two frequency dividers 48, 50 is to provide the phase discriminator 18 with signals at substantially the same frequency to be phase locked together. The effect of this is that the rate of the ring oscillator formed by the control delay line 10 can be greater than the clock rate and yet still be phase locked to and therefore frequency controlled by the clock.

It will be appreciated that in order that the control delay line 10 composed of a plurality of inverting delay elements should form a ring oscillator then the total number of stages 4 must be odd so that the signal which is fed back will cause the first stage 4 to change state. This change of state will then cause the next stage 4 to change state and so on down the control delay line 10. The point along the control delay line 10 actively changing state can be thought of as a wavefront of instability propagating along the control delay line 10. The embodiment illustrated in FIG. 4 has fifteen stages 4 and will be unstable when the feedback is applied, thereby forming a ring oscillator. Furthermore, in order for the control delay line 10 to complete a full cycle of its oscillation then the wavefront of the instability must have passed along the control delay line 10 twice so as to return the last stage 4 in the control delay line 10 to its starting state. Accordingly, since it is desired that samples read into the sample delay line 2 should span a period corresponding to one bit period, then the data rate should be twice the rate of oscillation of the control delay line 10. Each stage 4 will then introduce a delay of approximately one-fifteenth of a data bit period. A signal derived from the clock signal but having twice the rate can be used to trigger the reading of the samples from sample line 2 into the rest of the receiver circuit. Although it is theoretically possible for such a ring oscillator to be stable with an odd number of wavefronts of instability propagating along it (e.g., three), in operation such ring oscillators tend to collapse to the state with one wavefront propagating along them. In practice therefore the synchronization logic 14 may be omitted from such embodiments if so desired.

Figure 5:
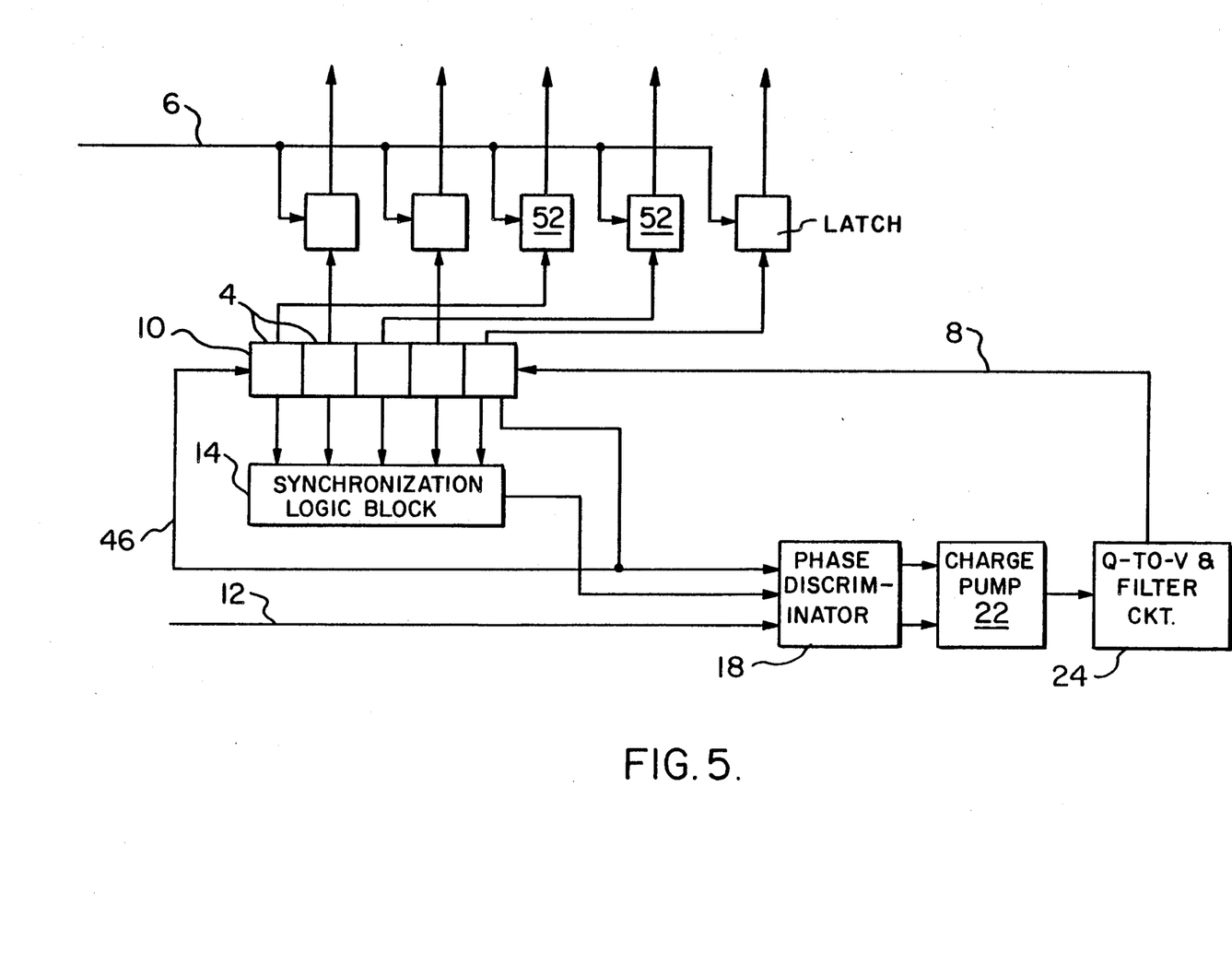
FIG. 5 schematically illustrates a third embodiment of a circuit for supplying the samples of the serial data stream to the rest of the receiver circuit.

FIG. 5 illustrates a further circuit for providing the samples to the shift registers of the receiver of the present invention. Those circuit elements which this circuit shares with either of the circuits illustrated in FIGS. 1 and 4 are given the same reference numerals in FIG. 5.

The control delay line 10 comprises five stages 4. The stages 4 of the control delay line 10 are configured as a ring oscillator. The second, fourth, first, third and fifth stages of the control delay line 10 provide signals to respective latches 52, which replace the sample delay line 2 of the two previous embodiments. A low-to-high transition within the stage 4 triggers the respective latch 52 to store the value on the data line 6. Each time the wavefront of the instability passes a particular stage, it alternately produces a low-to-high then a high-to-low transition. The arrangement whereby the feedback signal is tapped from the fifth stage 4 has the effect that the five latches 52 connected to the second, fourth, first, third and fifth respective stages of the control delay line 10 are triggered to sample the data line 6 in an equally spaced recurring sequence. The low-to-high transitions of the fifth stage 4 in the control delay line 10 are phase locked to the clock and thus five samples are stored per clock period, i.e., the wavefront of instability passing twice along the control line corresponds to one clock period which in turn corresponds to one data bit period. If it is desired to have a data rate higher than the clock rate, then a frequency divider could be provided between the fifth stage 4 of the control delay line 10 and the phase discriminator 18. The samples stored on the latches 52 may be read into the rest of the receiver circuit (to be described hereinafter) in a similar manner as for the circuits of FIGS. 1 and 4.

Figure 6:
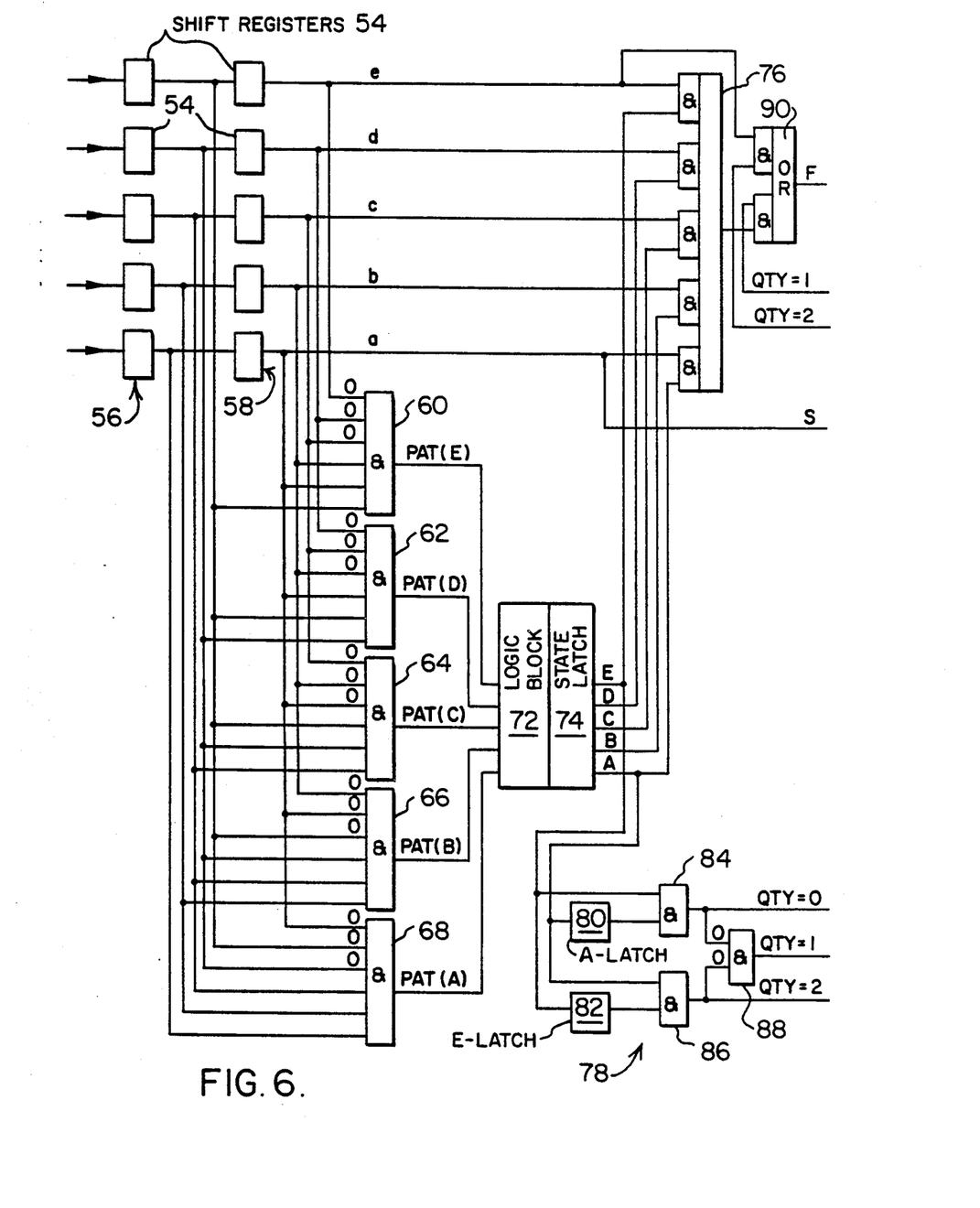
FIG. 6 schematically illustrates a decoder circuit in accordance with one embodiment of the present invention.

FIG. 6 schematically illustrates an embodiment of a decoder forming part of the receiver circuit in accordance with the present invention. The decoder extracts the data bits from the samples taken and is responsive to the phase of incoming data bits to ensure the correct samples are chosen for reading as data bits. The same clock is used for all the circuit elements illustrated in FIGS. 6 and 7.

Figure 8:
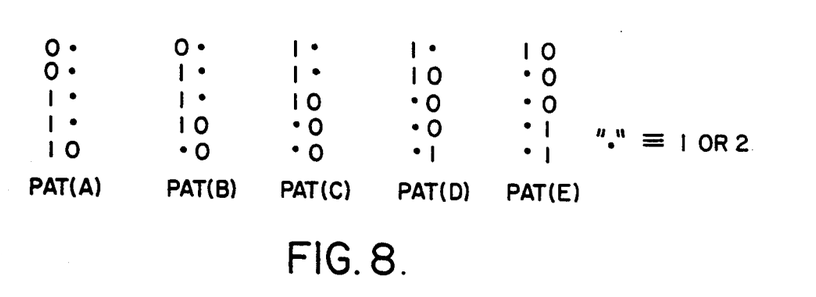
FIG. 8 illustrates the patterns of samples recognized by the decoder of FIG. 6.

The samples read from the data stream at the appropriately spaced times by the circuits of either FIGS. 1, 4 or 5 are fed to the five two stage shift registers 54. All ten stages of the shift registers are clocked by the same clock which is running at approximately the data rate. Stage 56 contains the most recent sample while stage 58 contains the oldest sample. The samples are separated by one-fifth of a data bit period and the shift registers hold data corresponding to two data bit period at any one time. Logic elements 60, 62, 64, 66 and 68 comprising six wide AND gates having inverters at three of their inputs are used to detect low-to-high transitions (zero=low and one=high in the following) by recognizing the patterns illustrated in FIG. 8. There are five possible patterns Pat(A), Pat(B), Pat(C), Pat(D) and Pat(E) none of which can be simultaneously present.

The recognition of a pattern provides the phase information using which the appropriate samples for reading may be selected. A low-to-high transition will not occur during every data bit period and so the phase information recovered is held by a 5-state state machine 70 which is fed signals from the logic elements 60, 62, 64, 66 and 68. If no low-to-high transition is detected or the same pattern as the previous pattern is detected, then the state of the 5-state state machine 70 is unchanged. If a different pattern than the previously-detected pattern is detected, then the state of the 5-state state machine 70 is changed As explained previously, the change of state required to compensate for the slight difference in the actual data rate and that timed by the receiver will only normally require the receiver to read the sample adjacent to that previously read. The recognition of a pattern indicating the need to switch to reading a sample other than the sample adjacent to the current sample being read will normally be the result of electrical noise. To minimize the effect of such electrical noise the state machine is constrained to only change state to indicate the reading of an adjacent sample even if the pattern indicates the reading of a sample further from that currently being read.

Figure 9:
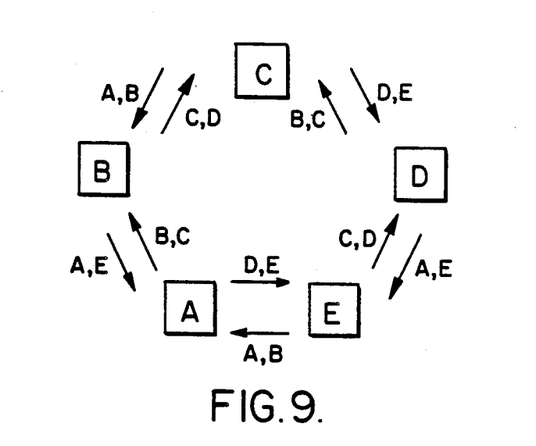
FIG. 9 illustrates the five possible states of a 5-state state machine shown in FIG. 6.

FIG. 9 illustrates the five possible states of the 5-state state machine 70 with the arrows between the states indicating the detected states which cause those transitions to occur. It will be seen that the 5-state state machine 70 moves towards the detected state by a maximum of one place. The logic required to implement this is shown as logic block 72 in FIG. 6, and will not be further described as appropriate forms are well known in the field. State latch 74 holds the current state of the 5-state state machine 70.

As illustrated in FIG. 6, the output of the state latch 74 controls a five wide AND-OR gate 76 whose function is to select the appropriate sample to be read from those stored in the shift registers. It will be seen from a comparison of FIGS. 6 and 8 that the sample selected to be read is that closest to the midpoint of the data bit for that state of the 5-state state machine 70.

As previously discussed, the receiver is able to cope with the situation in which either two or zero readable samples are present in any one period timed by the receiver. It will be seen that the situation in which two readable samples are present in one period corresponds to the 5-state state machine 70 switching from state E to state A. The situation in which zero readable samples are present corresponds to switching from state A to state E. It is the function of the sample number logic 78 to correct for this effect.

A-latch 80 records whether A was the previous state and its output is fed to AND gate 84 together with the current value on the line E. If the previous state was A and the current state is E, then the AND gate 84 provides a Qty=0 signal. Similarly, E-latch 82 records whether the previous state was E and the AND gate 86 combines this with the current signal on the line A two produce a Qty=2 signal if the current state is A.

If Qty=0 is low and Qty=2 is low, then AND gate 88 produces a Qty=1 signal. Only one of Qty=0, Qty=1 and Qty=2 can be high at any one time.

The Qty=1 and Qty=2 signals are fed to the two wide AND-OR gate 90. If Qty=1 is high, then the output of the five wide AND-OR gate 76 is selected and passed to the rest of the circuit on line F. If the Qty=2 signal is high, then the first and the last samples are read directly onto line F and S respectively. Thus, if the Qty=1 signal indicates that timed period contains one readable sample then the appropriate sample is gated onto line F. If the timed period contains two readable samples, then the first of these is provided on line F and the second on line S.

Figure 7:
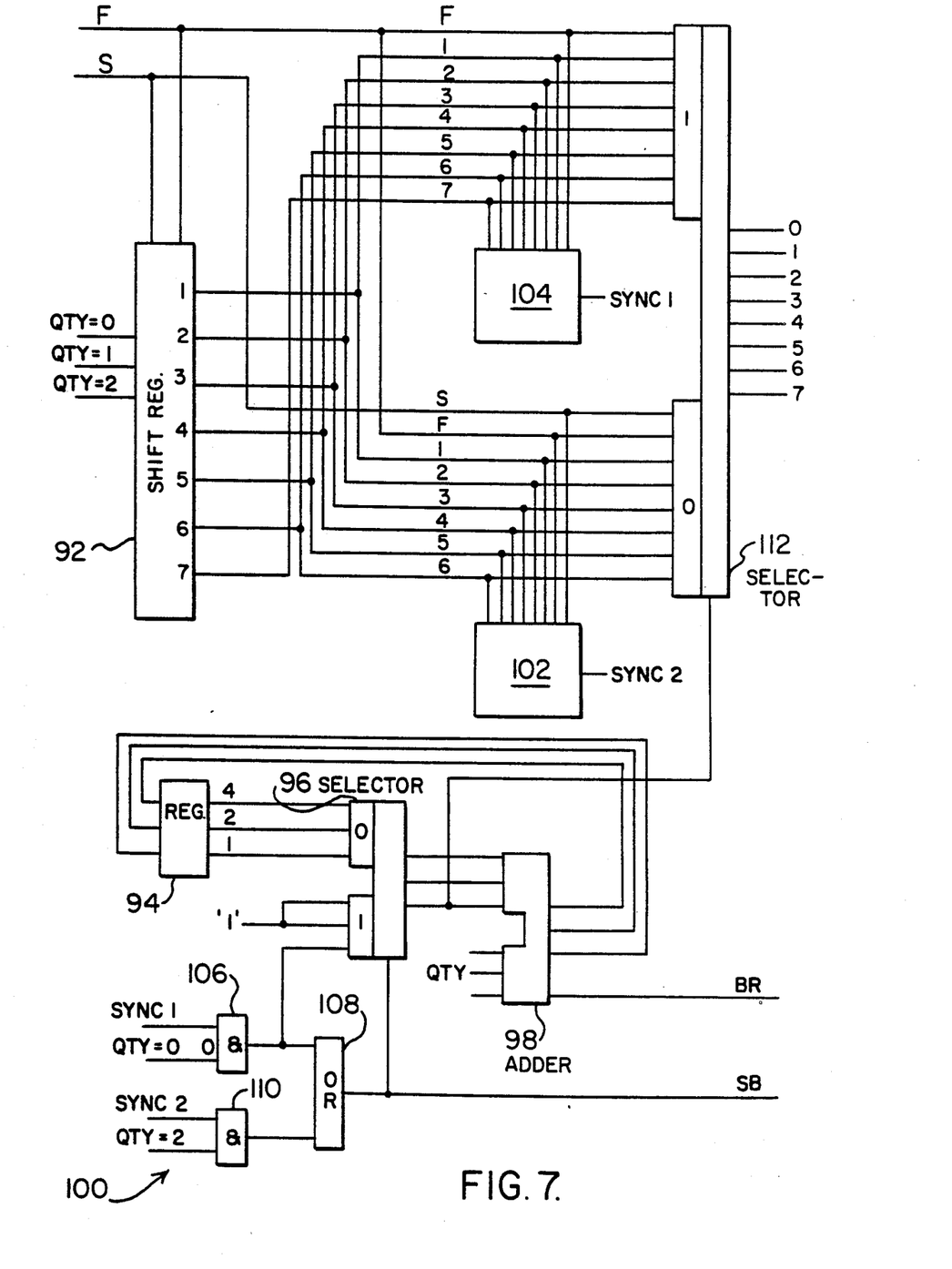
FIG. 7 schematically illustrates a circuit for collecting and outputting data words in accordance with one embodiment of the present invention.

Turning now to FIG. 7, this figure illustrates a circuit for collecting the decoded bits of data into data words and for recognizing synchronization words. The signals on lines F and S are fed to a 7-bit shift register 92. If the Qty=0 signal is high, then zero bits are clocked into the 7-bit shift register 92. If the Qty=1 signal is high, then the value on line F is clocked into the 7-bit shift register 92. If the Qty=2 signal is high, then first the value on line F is clocked into the 7-bit shift register 92 followed by the value on line S.

A 3-bit register 94 how many bits have been clocked into the 7-bit shift register 92 since its contents were last out as a data word. The adder control logic 100 determines whether the value stored in the 3-bit register 94 is to be appropriately added to or whether it is to be reset upon detection of a synchronization word (a synchronization word is a specially provided word provided within the data which cannot occur by chance within data to be transmitted and having identified which the receiver can determine how to split the data bit stream into data words). If the value in the 3-bit register 94 i be added to, then the selector 96 supplies the current value in the 3-bit register 94 to the adder 98 where the number of readable samples in the current period is added to it prior to return of the sum to the 3-bit register 94. When the value of eight is reached, then a byte ready BR signal is produced indicating that a data word is ready for reading.

Two synchronization word detectors 104 and 102 monitor the values stored in the 7-bit shift register 92 and the values on the lines F and S to determine when a synchronization word has been decoded. Synchronization byte detector 104 monitor all seven bits of the 7-bit shift register 92 together with the value on line F and produces a signal Sync1 when a synchronization word is detected. Synchronization byte detector 102 monitors the most recent six bits in the 7-bit shift register together with the signals on lines F and S and produces a signal Sync2 when a synchronization word is detected.

If Sync1 signal is high and the Qty=0 signal is low, then a valid synchronization word has been detected and AND gate 106 will go high thereby outputting a synchronization byte detect signal SB through OR gate 108. The high output of OR gate 108 causes selector 96 to supply a binary seven to the adder 98. The number of readable data bits in the current period is added to this to producing either zero or one indicating the number of valid bits of data remaining in the 7-bit shift register 92.

If the Qty=1 signal is high, then all seven bits of the 7-bit shift register 92 together with the value on line F represent the synchronization word with no decoded valid bits remaining. The value in the 3-bit register 94 is set to zero which reflects this. If the Qty=2 signal is high, then the value on the line S represents the first bit of the data word following the synchronization word on the 3-bit register 94 is reset to one to reflect this.

If the Sync2 signal is high and the Qty=2 is high, then a valid synchronization word has been detected and AND gate 110 goes high resulting in an synchronization byte detect signal SB being outputted through OR gate 108. The SB signal causes selector 96 to supply a binary six to the adder 98 where the number of readable samples in that period, i.e., two, is added resulting in the 3-bit register 94 being reset to zero.

When the byte ready signal indicates that a data word has been decoded, then the word is read from the output of selector 112. The number of readable data bits in that period is determined by monitoring whether the least significant bit in the 3-bit register 94 is either a one or a zero. If the least significant bit is zero, then this indicates six bits are pending in the 7-bit shift register 92 and selector 112 outputs the most recent six bits stored in the 7-bit shift register 92 together with the value on the F and S lines. If the least significant bit is one, then this indicates seven bits are pending in the 7-bit shift register 92 and all seven samples stored in the seven bit shift register 92 together with the signal on line F are outputted by the selector 112.

It can thus be seen that the circuit of FIG. 7 collects the decoded data bits into data words and triggers their reading at the appropriate point. The circuit also continuously monitors for synchronization words which indicate at what points the decoded stream of bits should be split into data words. The circuit is also able to take account of the number of readable samples in any period.

Overall, the receiver circuit described above provides a receiver capable of sampling at a rate above the clock rate, of extracting data bits without generating a clock phase locked to the data and allowing zero, one or two samples to be read per clock cycle.

Figure 10:
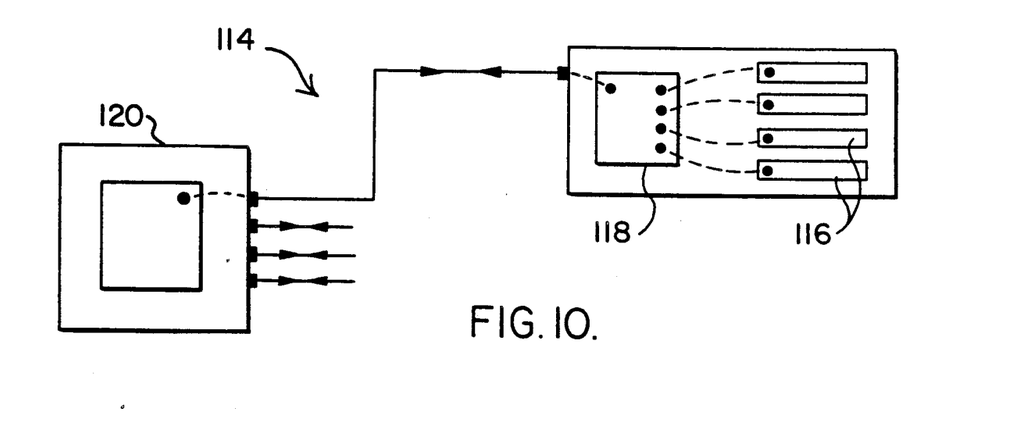
FIG. 10 illustrates a data storage and retrieval system including a plurality of disc drive and a plurality of serial data receivers as illustrated in FIGS. 1 to 9.

As mentioned previously, the present invention system is particularly useful for disc drives and data storage and retrieval systems in general. The receiver circuits required for use in the above devices would be the same as described above. Any modifications necessary will be apparent to those skilled in the art. FIG. 10 illustrates the use of the serial data receivers in a data storage and retrieval system comprising four disc drives 116 coupled with serial links to a disc drive controller 118. The disc drive controller is, in turn, connected via a serial link to an interface 120. Up to four disc drive controllers 118 may be connected to the interface 120. The interface passes data to and from a data processing device (not illustrated). Each of the serial links mentioned above is bidirectional and will have a serial data receiver in accordance with the present invention at each end of the serial link.

While the present invention has been described with reference to preferred embodiments thereof, it will be appreciated that those skilled in the art will, upon learning of the invention, visualize yet other embodiments that are within the spirit and scope of the invention. Thus, the invention is to be limited only by the claims hereof.

What is claimed is:

1. An asynchronous data receiver for receiving a stream of data bits, comprising:

a first shift register connected to receive data samples, said samples corresponding to points within less than one-half of a data bit period, a second shift register connected to receive said data samples from said first shift register, first logic means connected to the outputs of said first shift register and said second shift register for receiving data samples therefrom and for detecting low-to-high transitions to thereby provide phase information on said data samples, a state detector means connected to said first logic means for indicating a change of state whenever a phase shift is detected by said first logic means and for constraining the change of state to call for reading of a sample adjacent to the sample just previously read, even if the pattern detected indicates the reading of a sample further removed, and second logic means connected to said state detector means and to the output of said second shift register for selecting the appropriate sample to be read from said second shift register.

2. The data receiver of claim 1 further including:

byte synchronization means connected to receive output samples from said second shift register for detecting a synchronization word in said stream of data bits.

3. The data receiver of claim 2 wherein said byte synchronization means further includes:

bit collection means, counter means for counting the number of bits collected since the bit collection means was last read and to trigger reading of said bit collection means when an appropriate number of data bits have been collected, and monitor means connected to receive the output of said bit collection means for recognizing a synchronization word.

4. The data receiver of claim 1 further including:

input means connected to directly receive said stream of data bits for developing said data samples and for passing said samples to said first shift register.

5. The data receiver of claim 4 wherein said input means further includes:

a sample delay line means having a plurality of stages connected to receive said stream of data bits, local clock means for producing a stream of clock signals, control delay line means having a plurality of stages identical to the stages of said sample delay line means connected to receive said stream of clock signals, control line means connected to said sample delay line means and to said control delay line means for supplying a control signal to control the rate at which samples are read into said sample delay line means and propagated from stage-to-stage, and to control the rate at which clock signals are read into said control delay line means and propagated from stage-to-stage, and means connected to said control delay line means for altering timing of said control signal to phase lock said control delay line to said local clock signal.

6. The data receiver of claim 5 wherein said control delay line means is a ring oscillator.

7. The data receiver of claim 4 wherein said input means is comprised of a plurality of latches, each latch being read into said first shift register.

8. The data receiver of claim 3 further including:

input means connected to directly receive said stream of data bits for developing said data samples and for passing said samples to said first shift register.

9. The data receiver of claim 8 wherein said input means further includes:

a sample delay line means having a plurality of stages connected to receive said stream of data bits, local clock means for producing a stream of clock signals, control delay line means having a plurality of stages identical to the stages of said sample delay line means connected to receive said stream of clock signals, control line means connected to said sample delay line means and to said control delay line means for supplying a control signal to control the rate at which samples are read into said sample delay line means and propagated from stage-to-stage, and to control the rate at which clock signals are read into said control delay line means and propagated from stage-to-stage, and means connected to said control delay line means for altering timing of said control signal to phase lock said control delay line to said local clock signal.

10. The data receiver of claim 9 wherein said control delay line means is a ring oscillator.

11. The data receiver of claim 8 wherein said input means is comprised of a plurality of latches, each latch being read into said first shift register.

* * * * *